United States Patent
Wen et al.

(10) Patent No.: US 9,893,191 B2
(45) Date of Patent: Feb. 13, 2018

(54) FINFET TRANSISTOR WITH U-SHAPED CHANNEL

(71) Applicant: Taiwan Semiconductor Manufacturing Company, Ltd., Hsin-Chu (TW)

(72) Inventors: Tsung-Yao Wen, Hsinchu (TW); Mao-Nan Wang, Hsinchu (TW); Sai-Hooi Yeong, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/464,498

(22) Filed: Aug. 20, 2014

(65) Prior Publication Data
US 2016/0056295 A1    Feb. 25, 2016

(51) Int. Cl.
*H01L 27/11* (2006.01)
*H01L 29/06* (2006.01)
(Continued)

(52) U.S. Cl.
CPC ...... *H01L 29/7856* (2013.01); *H01L 27/1104* (2013.01); *H01L 27/1116* (2013.01);
(Continued)

(58) Field of Classification Search
CPC ............ H01L 29/7853; H01L 29/0657; H01L 21/823431; H01L 21/823821; H01L 21/845; H01L 27/0886; H01L 27/0924; H01L 27/10826; H01L 27/10879; H01L 27/1211; H01L 29/41791;
(Continued)

(56) References Cited

U.S. PATENT DOCUMENTS 5,563,077 A * 10/1996 Ha .................. H01L 29/785
257/401
6,271,063 B1 * 8/2001 Chan et al. ............. 438/153
(Continued)

FOREIGN PATENT DOCUMENTS

JP      1994061260 A    3/1994
JP      2007042790 A    2/2007
(Continued)

OTHER PUBLICATIONS

Korean Intellectual Property Office, Notice of Allowance dated Feb. 26, 2016, Application No. 10-2014-0193936.

*Primary Examiner* — Kevin Parendo
(74) *Attorney, Agent, or Firm* — Haynes and Boone, LLP

(57) ABSTRACT

A semiconductor device having a u-shaped FinFET and methods of forming the same are disclosed. The semiconductor device includes a substrate and a fin over the substrate, wherein the fin has a u-shape from a top view with first and second arm portions and a bridge portion connecting the first and second arm portions. The semiconductor device further includes a first gate over the substrate, engaging the fin at both the first and second arm portions and the bridge portion. A source region of the FinFET is formed in the first arm portion, a drain region of the FinFET is formed in the second arm portion, and a channel region of the FinFET is formed in the fin between the source region and the drain region.

20 Claims, 14 Drawing Sheets

(51) Int. Cl.
- *H01L 29/423* (2006.01)
- *H01L 29/51* (2006.01)
- *H01L 29/66* (2006.01)
- *H01L 29/78* (2006.01)
- *H01L 21/8238* (2006.01)
- *H01L 21/8234* (2006.01)

(52) U.S. Cl.
CPC ...... *H01L 29/0657* (2013.01); *H01L 29/4238* (2013.01); *H01L 29/42356* (2013.01); *H01L 29/42376* (2013.01); *H01L 29/512* (2013.01); *H01L 29/513* (2013.01); *H01L 29/517* (2013.01); *H01L 29/518* (2013.01); *H01L 29/66795* (2013.01); *H01L 29/7851* (2013.01); *H01L 29/7853* (2013.01); *H01L 21/823412* (2013.01); *H01L 21/823431* (2013.01); *H01L 21/823807* (2013.01); *H01L 21/823814* (2013.01); *H01L 21/823821* (2013.01)

(58) Field of Classification Search
CPC ...... H01L 29/66795–29/6681; H01L 29/7831; H01L 29/785–29/7856; H01L 2029/7857–2029/7858; H01L 29/42356; H01L 29/42376; H01L 29/4238
See application file for complete search history.

(56) References Cited

U.S. PATENT DOCUMENTS

| | | | |
|---|---|---|---|
| 7,655,989 | B2 | 2/2010 | Zhu et al. |
| 8,647,938 | B1 | 2/2014 | Baars et al. |
| 8,963,201 | B2* | 2/2015 | Shrivastava et al. ......... 257/167 |
| 2007/0171700 | A1* | 7/2007 | Burnett et al. ................ 365/154 |
| 2008/0164535 | A1* | 7/2008 | Chidambarrao et al. ..... 257/401 |
| 2008/0308880 | A1* | 12/2008 | Inaba ............................ 257/401 |
| 2009/0007036 | A1* | 1/2009 | Cheng et al. ..................... 716/5 |
| 2011/0204419 | A1* | 8/2011 | Johnson et al. ............. 257/204 |
| 2012/0049279 | A1* | 3/2012 | Shrivastava et al. ......... 257/347 |
| 2012/0126326 | A1* | 5/2012 | Wang et al. .................. 257/365 |
| 2013/0181297 | A1* | 7/2013 | Liaw ............................ 257/390 |
| 2013/0285143 | A1 | 10/2013 | Oh et al. |

FOREIGN PATENT DOCUMENTS

| | | |
|---|---|---|
| JP | 2013179343 A | 9/2013 |
| KR | 10201130120201 A | 11/2013 |

* cited by examiner

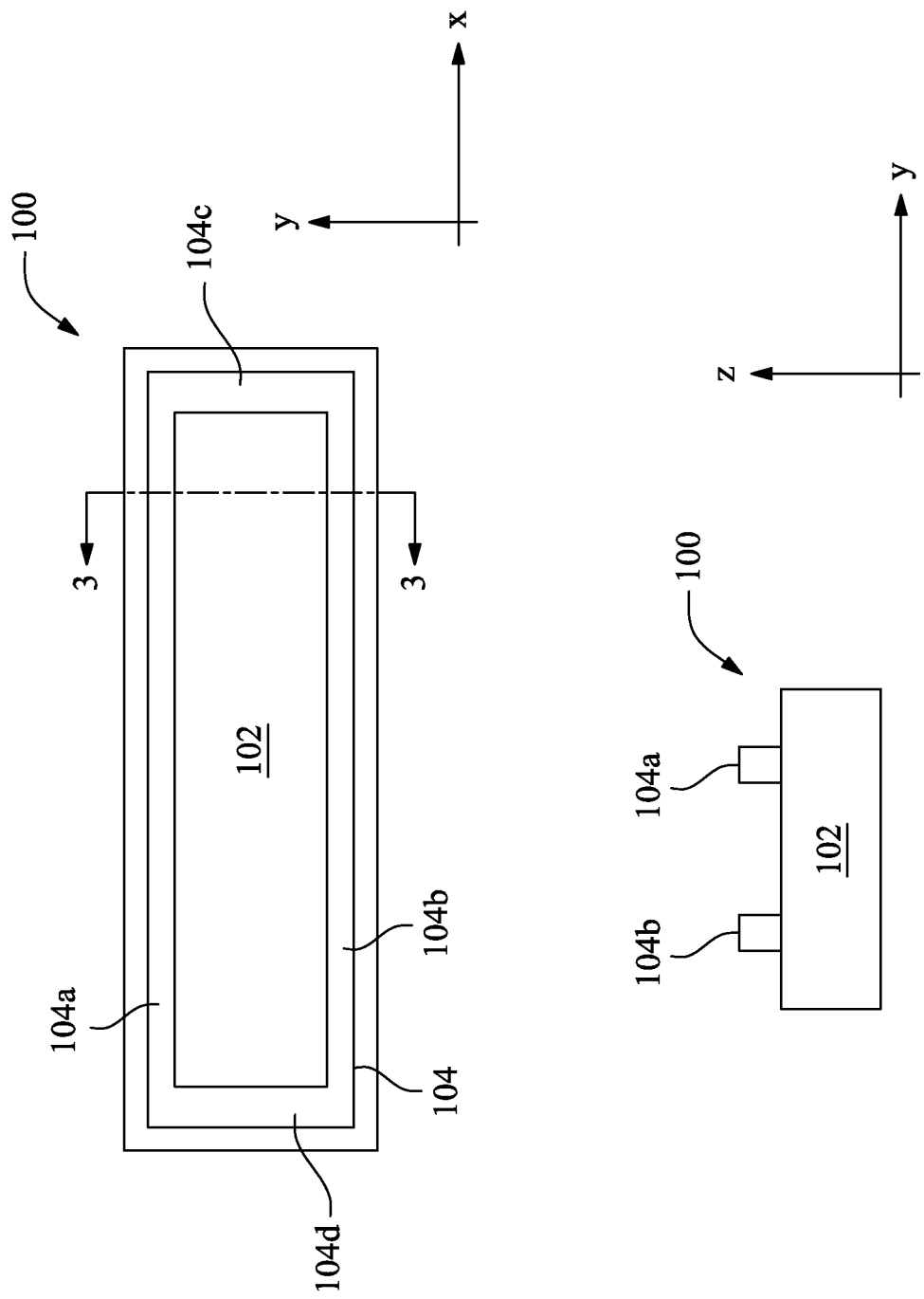

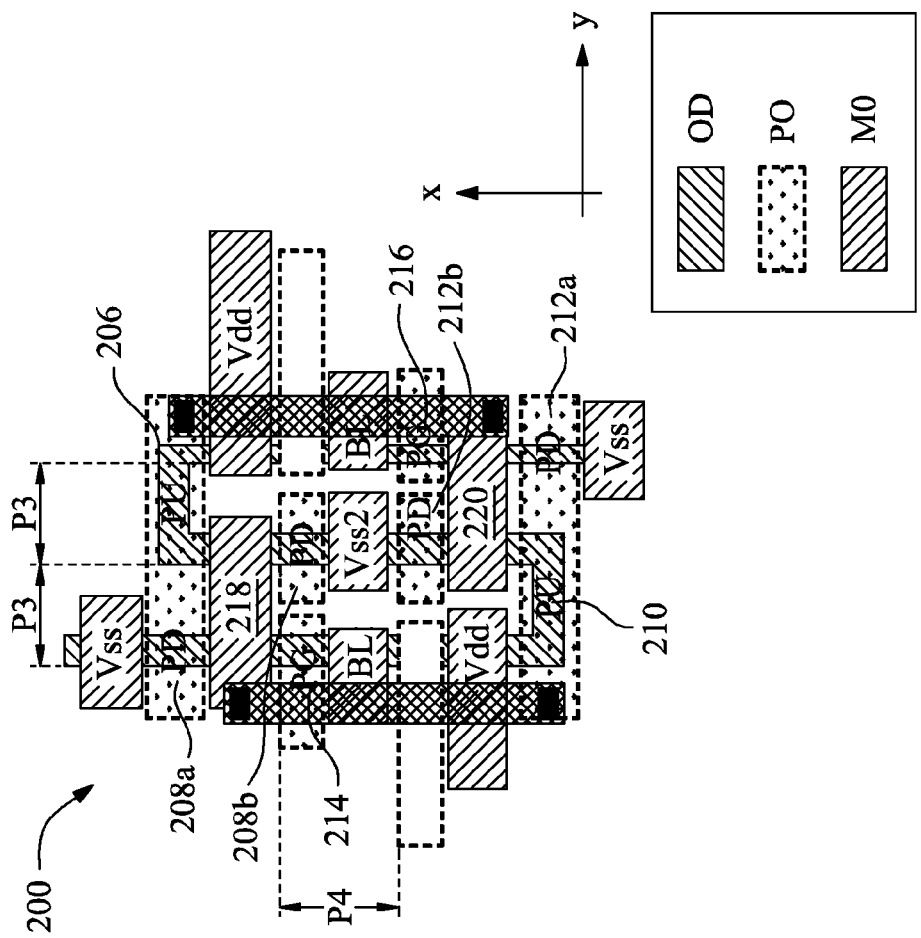
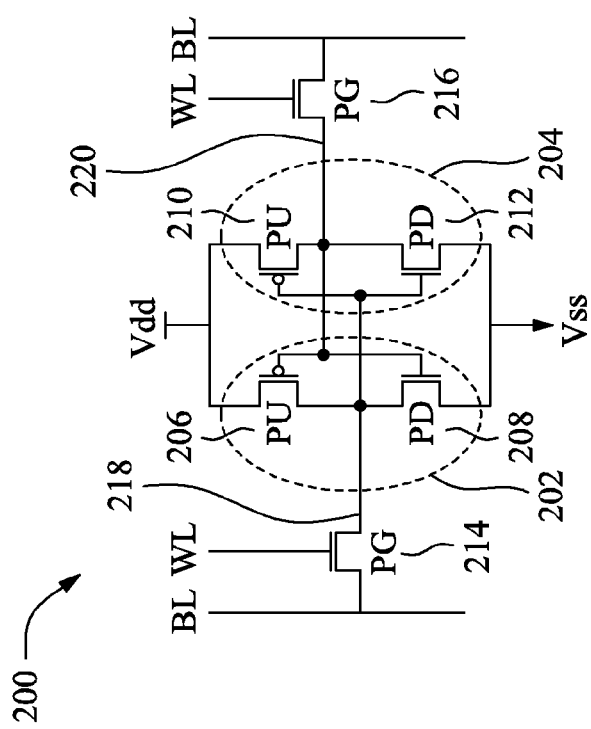
FIG. 8A
FIG. 8B

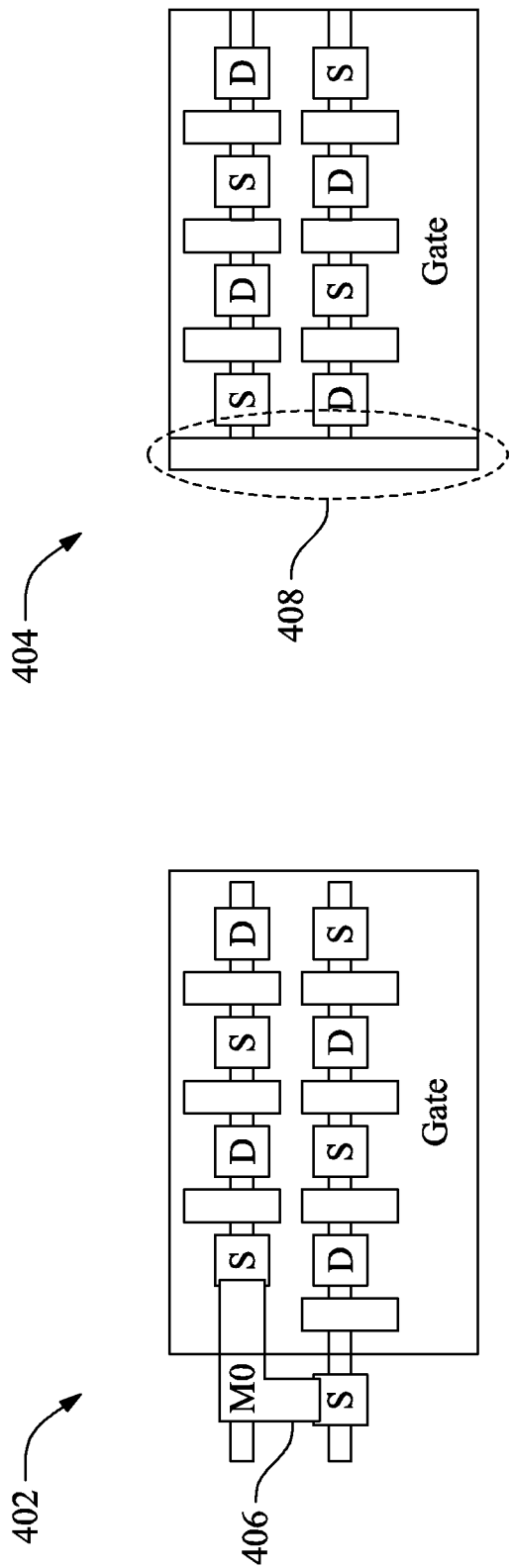

FINFET TRANSISTOR WITH U-SHAPED CHANNEL

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, a spacer technique is used to form fins for fin-like field effect transistor (FinFET) devices in order to meet increased demand for circuit density in spite of limitations of photolithography exposure tools. In a typical spacer technique, a mandrel pattern is formed over a substrate by photolithography, and a spacer is formed on sidewalls of the mandrel pattern by deposition and etching processes. Then, the mandrel pattern is removed, leaving the spacer over the substrate. The spacer generally has a closed shape. Before etching the substrate, the typical spacer technique employs a cut process to cut out portions of the spacer, resulting in disjoined spacer patterns. The substrate is then etched with the disjoined spacer patterns as an etch mask thereby forming the fins. The portion of the substrate that corresponds to the cut-out portions of the spacer is removed during the etching process, wasting valuable resources.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-4B illustrate the semiconductor device of FIG. 1 at intermediate fabrication stages, in accordance with some embodiments.

FIGS. 8A and 8B show, respectively, a schematic diagram and a layout diagram of a static random access memory (SRAM) device constructed according to various aspects of the present disclosure.

FIGS. 9A and 9B show layout diagrams of two semiconductor devices in accordance with some embodiments.

DETAILED DESCRIPTION

Figure 1:
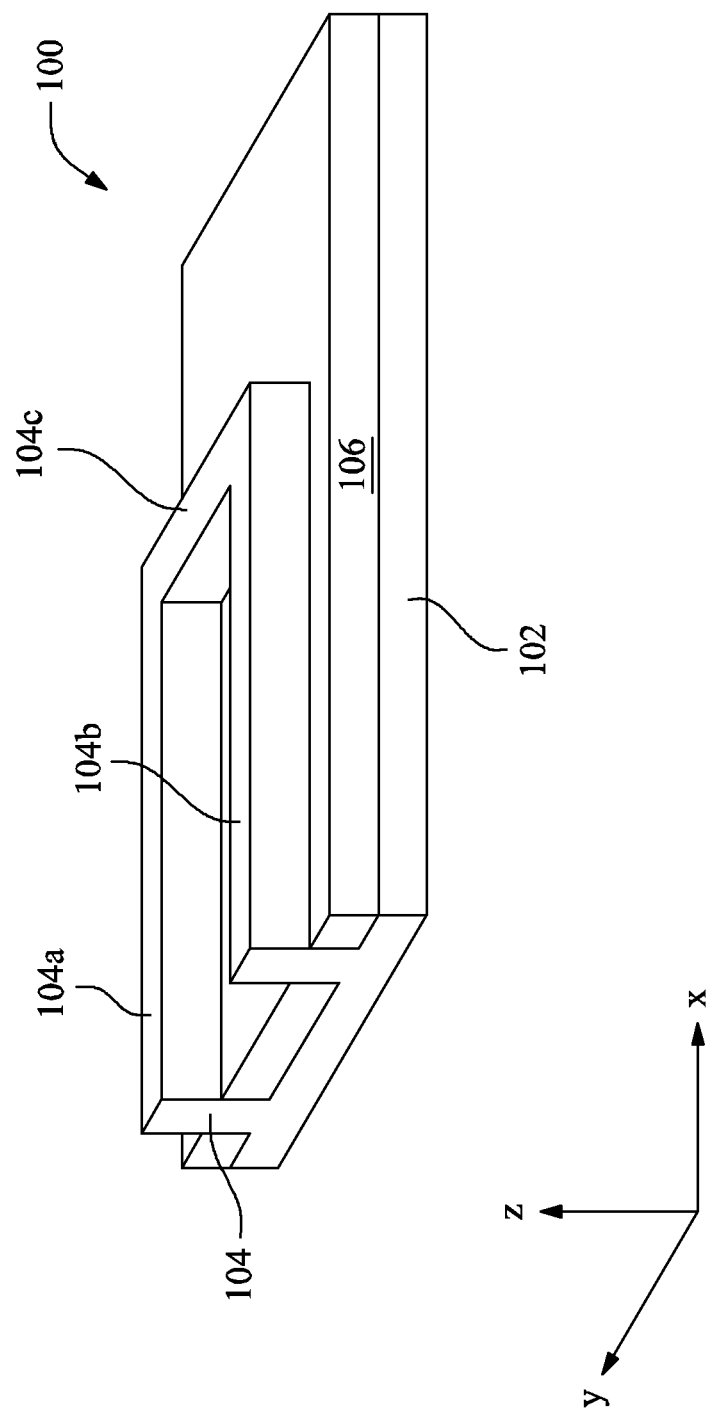
FIG. 1 is a perspective view of a portion of a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to FinFET devices having u-shaped channels from a top view. As discussed above, a portion of a substrate might be wasted in FinFET fabrication using typical spacer techniques. Therefore, it is an objective of the present disclosure to provide methods for increasing utilization of the substrate during FinFET fabrication. Furthermore, the present disclosure provides a novel FinFET device that has a u-shaped channel region between its source and drain regions. The novel FinFET device can be used to increase circuit density, for example, in static random access memory (SRAM) designs.

Referring to FIG. 1, shown therein is a portion of a semiconductor device 100 constructed according to various aspects of the present disclosure. The device 100 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof. The device 100 and methods of making the same will be described below in accordance with embodiments of the present disclosure. However, the present disclosure is not limited by specific configurations of the device 100. Embodiments of the present disclosure may include different types of devices, different number of devices, and/or different configuration of structures.

With continued reference to FIG. 1, the device 100 includes a substrate 102, one or more fins 104 projecting upwardly from the substrate 102, and an isolation structure 106 over the substrate 102.

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) such as a buried dielectric layer.

The fin 104 includes three portions, 104a, 104b, and 104c, configured in a u-shape from a top view of the device 100. Specifically, the portions 104a and 104b constitute two arm portions of the u-shape and the portion 104c constitutes a bridge portion of the u-shape that connects the two arm portions. Hereinafter, the fin portions 104a and 104b are also referred to as arm portions (or arms) 104a and 104b respectively, while the fin portion 104c is also referred to as a bridge portion (or bridge) 104c. In an embodiment, the arms 104a and 104b are linear structures and are oriented along a first direction ("x" direction of FIG. 1) and spaced away from each other, and the bridge 104c is a linear structure and is oriented along a second direction ("y" direction of FIG. 1) orthogonal to the first direction. The fin 104 (including the portions 104a, 104b, and 104c) is suitable for forming n-type FETs, p-type FETs, or both.

The isolation structure 106 may be formed of silicon oxide, silicon nitride, silicon oxynitride, fluoride-doped silicate glass (FSG), a low-k dielectric material, and/or other suitable insulating material. The isolation structure 106 may be shallow trench isolation (STI) features. In an embodiment, the isolation structure 106 is formed by etching trenches in the substrate 102, e.g., as part of the fin 104 formation process. The trenches may then be filled with isolating material, followed by a chemical mechanical planarization (CMP) process and an etching process to recess the isolating material lower than a top surface of the fin 104. Other isolation structure 106 such as field oxide, LOCal Oxidation of Silicon (LOCOS), and/or other suitable structures are possible. The isolation structure 106 may include a multi-layer structure, for example, having one or more thermal oxide liner layers.

Figures 2A, 2B:
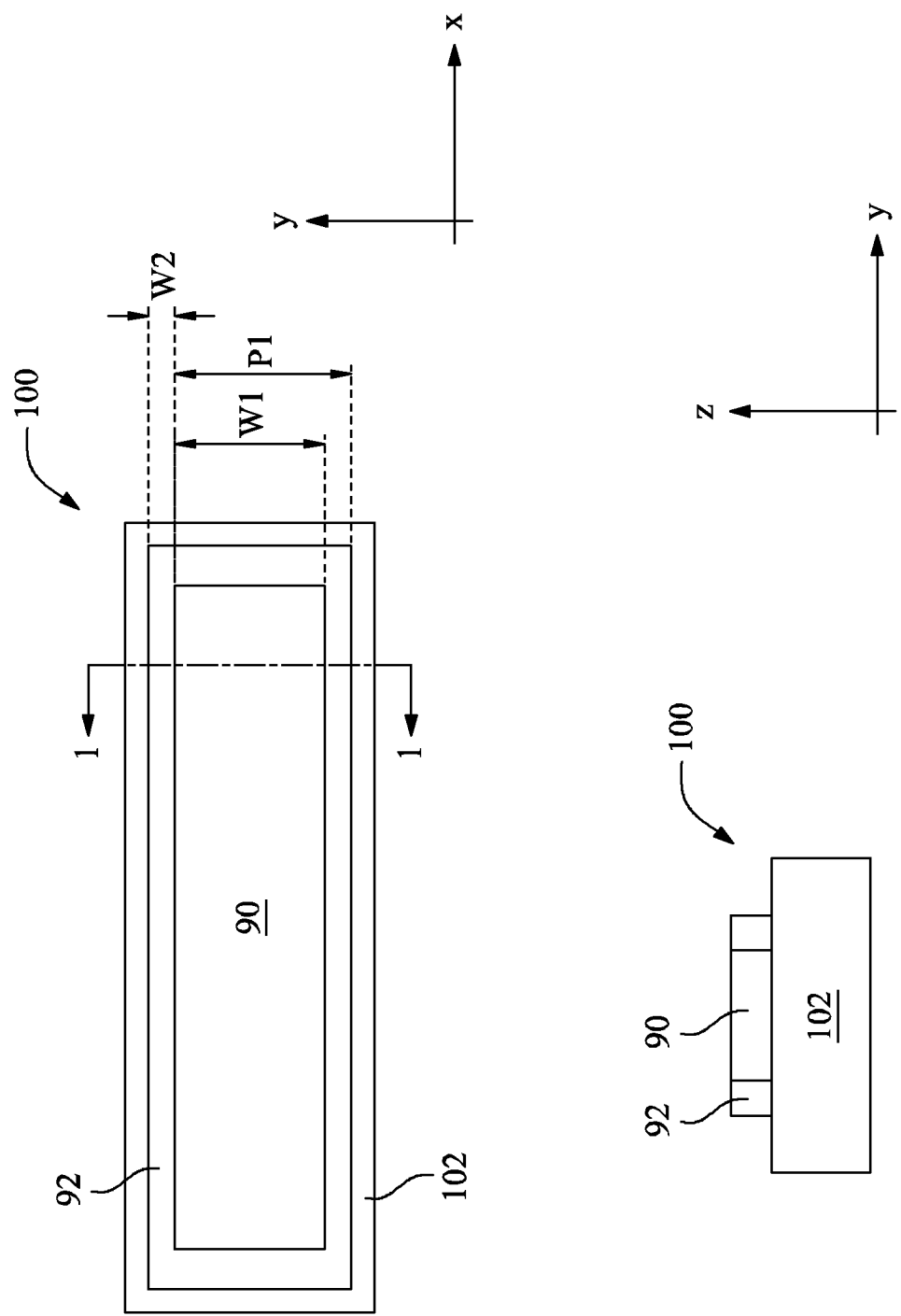

FIGS. 2A-4B illustrate simplified top and cross-sectional views of the device 100 during various fabrication stages of forming the fin 104, in accordance with some embodiments. Refer to FIGS. 2A and 2B where FIG. 2B is a cross-sectional view of FIG. 2A along the 1-1 line of FIG. 2A. A mandrel pattern 90 is formed as a line over the substrate 102 using a process that may include a deposition process, a photolithography process, and an etching process. For example, the deposition process may form one or more layers of material or composition over the substrate 102, such as a nitrogen-free anti-reflection coating (NFARC) layer and/or a hard mask layer. The photolithography process may include resist coating, soft baking, exposing, post-exposure baking, developing, and hard baking in one example. In an embodiment, the mandrel pattern 90 is a developed resist. In another embodiment, the mandrel pattern 90 is formed by etching a hard mask layer using a developed resist as an etch mask. The etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. As shown in FIG. 2A, the mandrel pattern 90 has a dimension "W1" along the "y" direction.

With continued reference to FIGS. 2A and 2B, after the mandrel pattern 90 has been formed, a spacer 92 is formed around the mandrel pattern 90 and over sidewalls of the mandrel pattern 90. The spacer 92 includes one or more material different from the mandrel pattern 90. In one embodiment, the spacer 92 may include a dielectric material, such as titanium nitride, silicon nitride, or titanium oxide. The spacer 92 can be formed by various processes, including a deposition process and an etching process. For example, the deposition process includes a chemical vapor deposition (CVD) process or a physical vapor deposition (PVD) process. For example, the etching process includes an anisotropic etch such as plasma etch. As shown in FIG. 2A, spacer 92 is formed to have a width "W2." A pitch "P1" between the horizontal (the "x" direction) portions of the spacer 92 is substantially equal to a total of "W1" and "W2."

In an alternative embodiment, the mandrel pattern 90 is formed as a trench (not shown) rather than a line and the spacer 92 is formed inside the trench and over sidewalls of the trench.

Figure 3A:
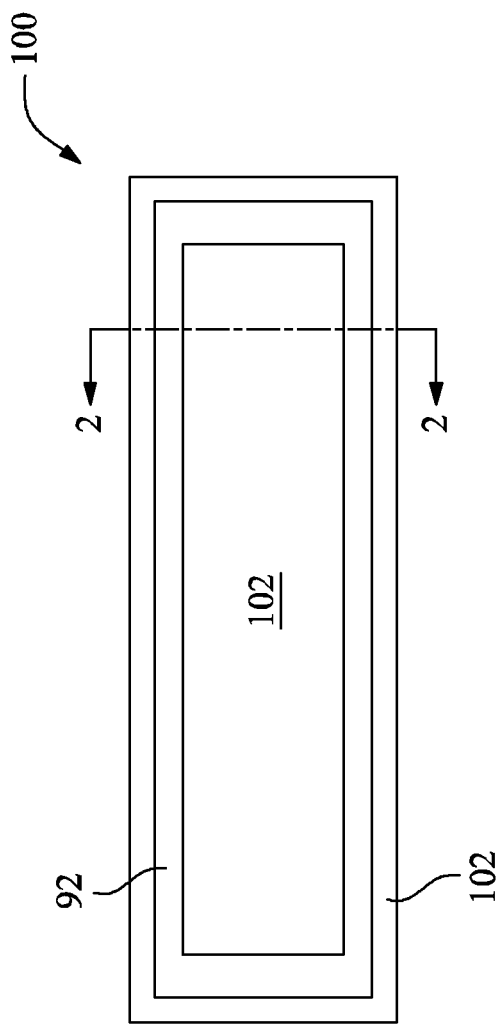
Figure 3B:
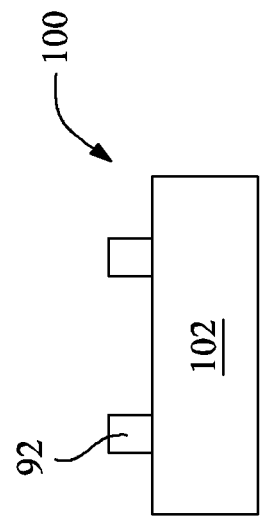

Refer to FIGS. 3A and 3B where FIG. 3B is a cross-sectional view of FIG. 3A along the 2-2 line of FIG. 3A. The mandrel pattern 90 (FIGS. 2A and 2B) is removed by an etching process selectively tuned to remove the mandrel pattern 90 while the spacer 92 remains substantially unchanged during the etching process, leaving the spacer 92 over the substrate 102 as an etch mask for further processes.

Refer to FIGS. 4A and 4B where FIG. 4B is a cross-sectional view of FIG. 4A along the 3-3 line of FIG. 4A. The substrate 102 is etched with the spacer 92 (FIGS. 3A and 3B) as an etch mask and the spacer 92 is thereafter removed. This results in the fin 104 being formed over the substrate 102 with the three portions 104a, 104b, and 104c illustrated in FIG. 1 and a fourth portion 104d not illustrated in FIG. 1. Specifically, the horizontal (the "x" direction) portions, 104a and 104b, correspond to the respective horizontal portions of the spacer 92, and the vertical (the "y" direction) portions, 104c and 104d, correspond to the respective vertical portions of the spacer 92. A subsequent oxide deposition and recess process may be performed to form the isolation structure 106 as discussed above with respect to FIG. 1.

Alternative embodiments of forming the fin 104 and the isolation structure 106 are possible. For example, in an embodiment, the isolation structure 106 is formed as an oxide layer over the substrate 102. A patterning process (e.g., as discussed with respect to FIGS. 2A-4B) is used to etch the isolation structure 106 and forms openings therein exposing the substrate 102. An epitaxial growth process is performed to grow the fin 104 out of the openings, resulting in the device 100 as shown in FIG. 1.

Figure 5A:
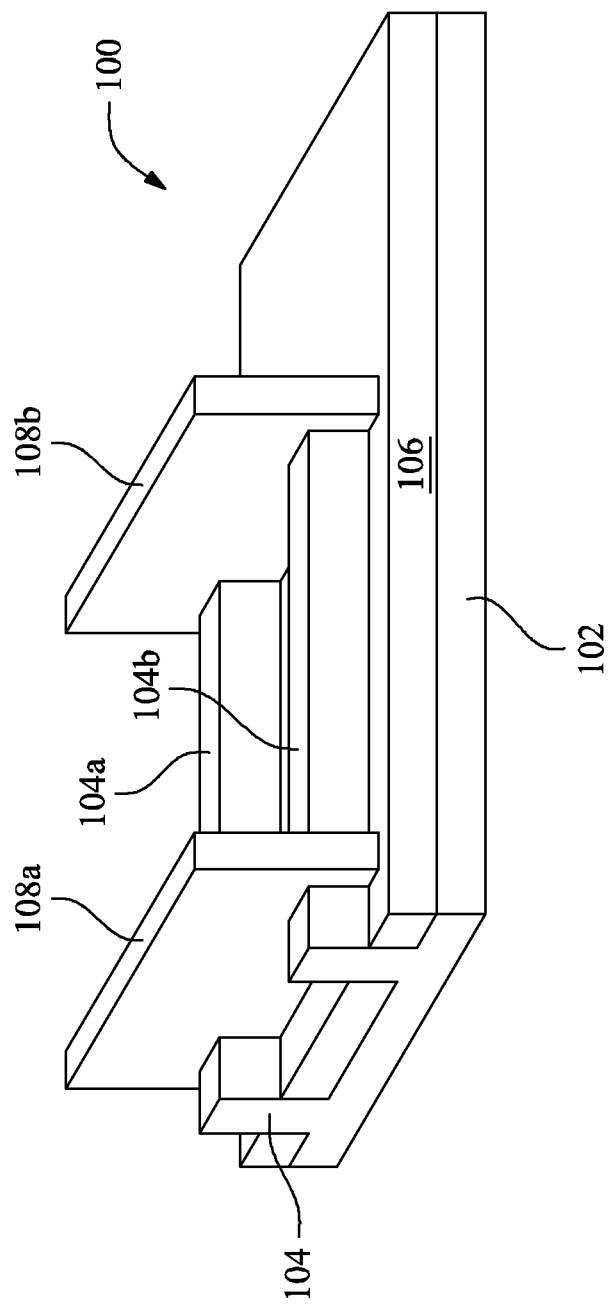
FIG. 5A illustrate the semiconductor device of FIG. 1 after further features are fabricated in accordance with some embodiments.

FIG. 5A shows a perspective view of the device 100 after two gates 108a and 108b have been formed over the substrate 102. Particularly, the gate 108a engages the fin 104 at the arms 104a and 104b, and the gate 108b engages the fin 104 at the arms 104a and 104b and the bridge 104c (FIG. 1). In the embodiment as shown, the gate 108b engages the fin 104 over both a top surface of and sidewalls of the fin 104 (three sides). Therefore, the bridge portion 104c becomes completely buried underneath the gate 108b. In another embodiment, the gates 108a and 108b only engage the fin 104 on the sidewalls of the fin 104 (two sides). Therefore, the top surface of the bridge 104c is not buried underneath the gate 108b. Other embodiments of gates 108a and 108b are possible, such as gate-all-around (GAA) types.

Figure 5B:
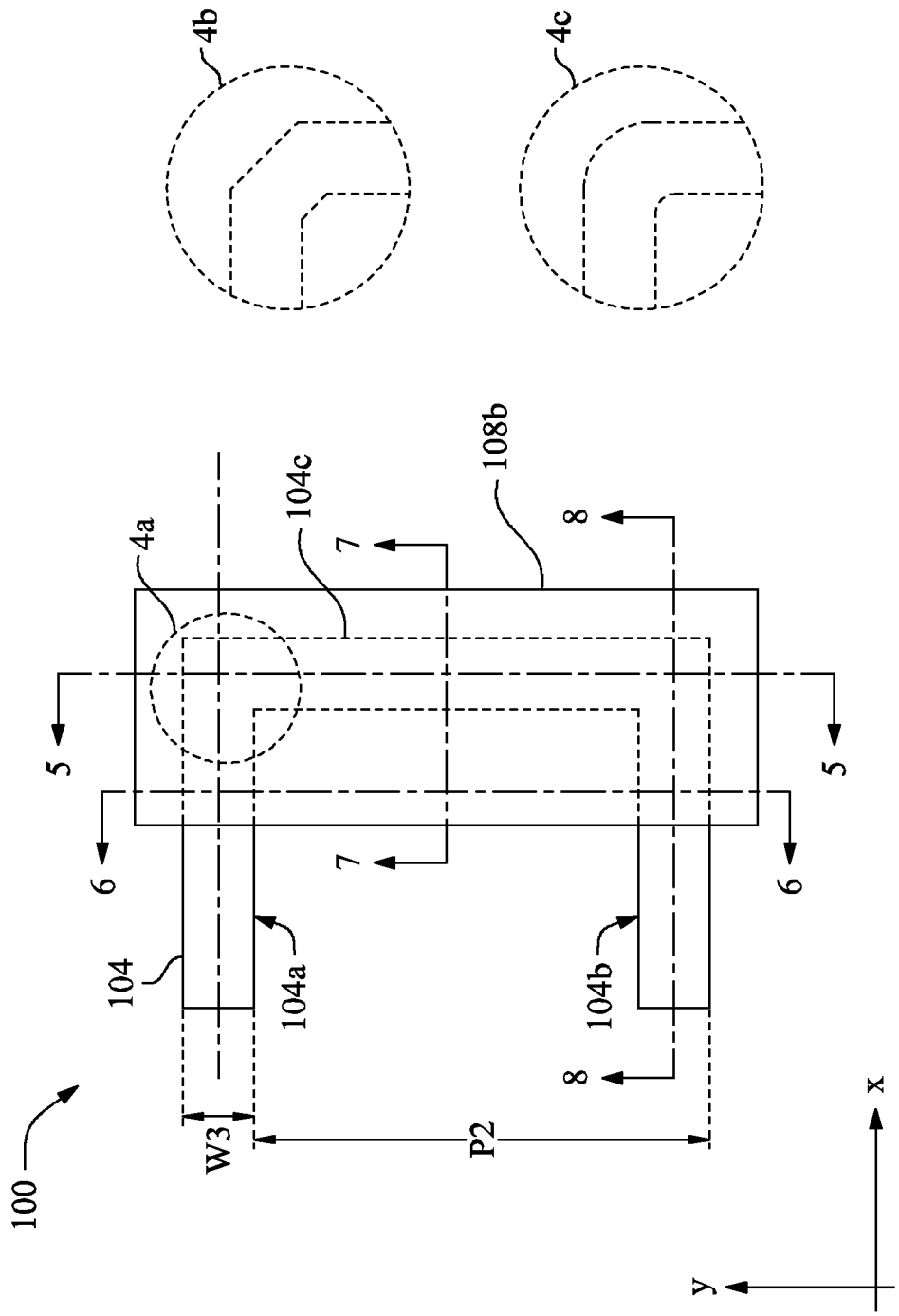
FIGS. 5B-5F are top and cross-sectional views of the semiconductor device of FIG. 5A, in accordance with an embodiment.
Figure 5C:
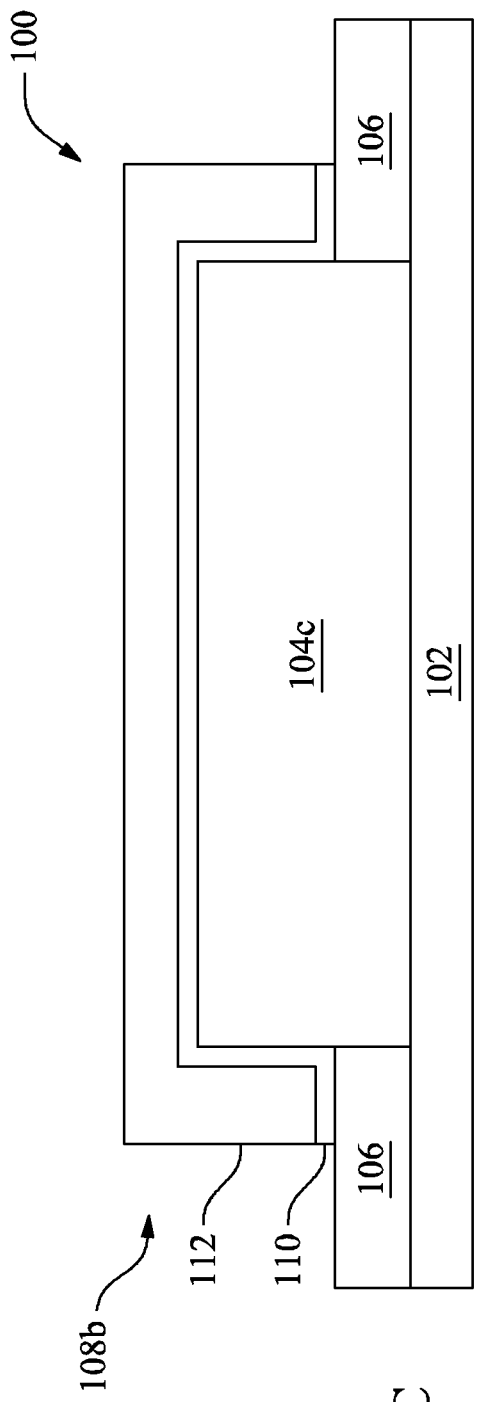
Figure 5D:
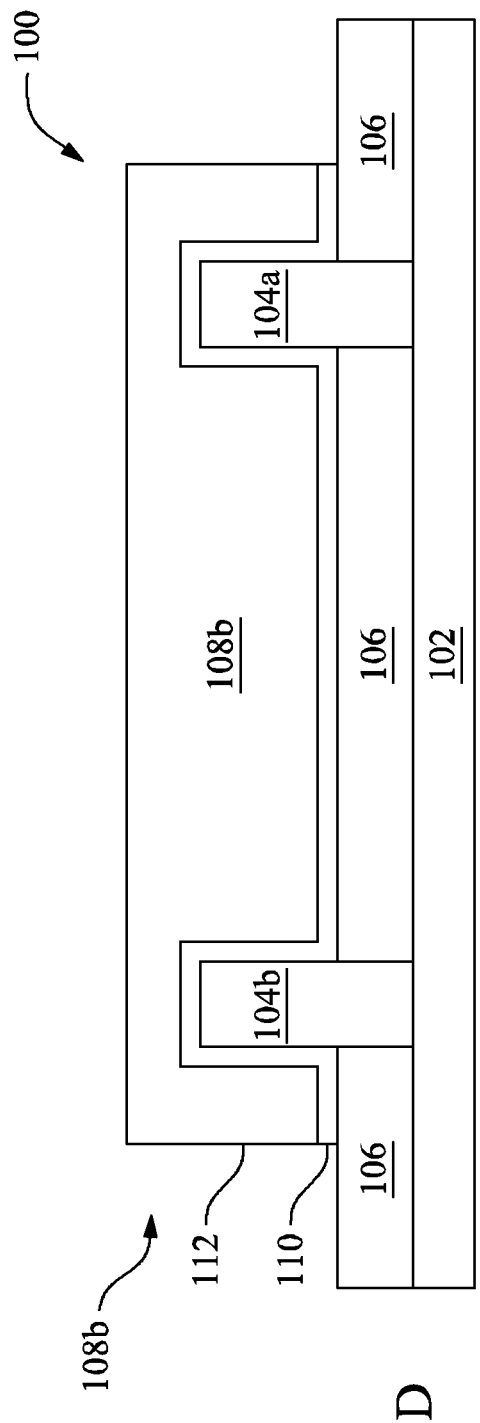
Figure 5E:
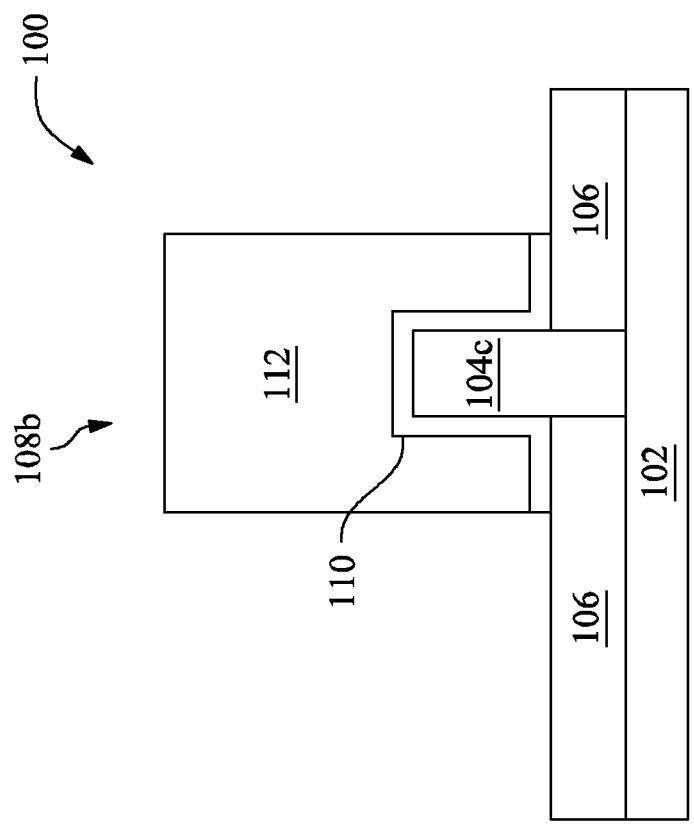
Figure 5F:
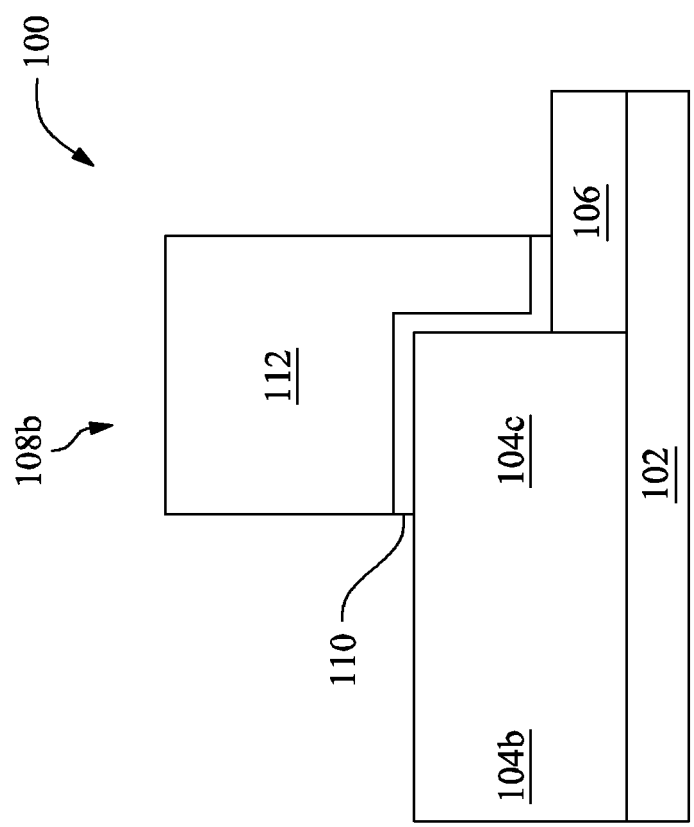

FIG. 5B shows a simplified top view of a portion of the device 100 that includes the gate 108b, portions of the arm 104a and 104b, and the bridge 104c which is underneath the gate 108b (therefore shown as dashed lines). In the embodiment as shown, the bridge 104c connects the arms 104a and 104b with angular intersections (view 4a) where the angles are approximately 90 degrees. Alternatively, the bridge 104c may connect the arms 104a and 104b through another fin portion (view 4b) or with a curvy intersection (view 4c). Such intersections (views 4b and 4c) may provide benefits of enhanced manufacturability and enhanced circuit performance. In an embodiment, such intersections may be made, at least partially, through optical proximity correction (OPC) to the mandrel pattern 90 (FIG. 2A) or through other methods, such as optimized etching or trimming processes. Also shown in FIG. 5B, the fin 104 has a width "W3" and the arms 104a and 104b are spaced away in the "y" direction by a pitch "P2." The dimensions "W3" and "P2" are substantially equal to the respective dimensions "W1" and "P1" of FIG. 2A, taking into account of variations in pattern transfer. Furthermore, in the embodiment as shown, the gate 108b is a linear structure and is oriented along the "y" direction. The gate 108b extends beyond the bridge 104c in both "x" and "y" directions and overlaps a portion of the arms 104a and 104b.

FIGS. 5C, 5D, 5E, and 5F are cross-sectional views of the device 100 along the 5-5, 6-6, 7-7, and 8-8 lines of FIG. 5B respectively. Referring to FIGS. 5C-5F collectively, the gate 108b is a multi-layer structure. Although not shown, the gate 108a has similar multi-layer structure in an embodiment. In the embodiment as shown, the gate 108b includes an interfacial layer 110 and a polysilicon (or poly) layer 112 over the interfacial layer 110. In some embodiments, the gate 108b may further include a gate dielectric layer and a metal gate layer disposed between the interfacial layer 110 and the poly layer 112. In some embodiments, the gate 108b includes one or more metal layers in place of the poly layer 112. In various embodiments, the interfacial layer 110 includes a dielectric material such as silicon oxide ($SiO_2$) or silicon oxynitride (SiON), and can be formed by chemical oxidation, thermal oxidation, atomic layer deposition (ALD), chemical vapor deposition (CVD), and/or other suitable methods. The poly layer 112 can be formed by suitable deposition processes such as low-pressure chemical vapor deposition (LPCVD) and plasma-enhanced CVD (PECVD). The gate dielectric layer may use a high-k dielectric material such as hafnium oxide ($HfO_2$), $Al_2O_3$, lanthanide oxides, $TiO_2$, HfZrO, $Ta_2O_3$, $HfSiO_4$, $ZrO_2$, $ZrSiO_2$, combinations thereof, or other suitable material; and may be formed by ALD and/or other suitable methods. The metal gate layer may include a p-type work function metal or an n-type work function metal, and may be deposited by CVD, PVD, and/or other suitable process. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The one or more metal layers may use aluminum (Al), tungsten (W), copper (Cu), cobalt (Co), and/or other suitable materials; and may be formed by CVD, PVD, plating, and/or other suitable processes.

Figure 6:
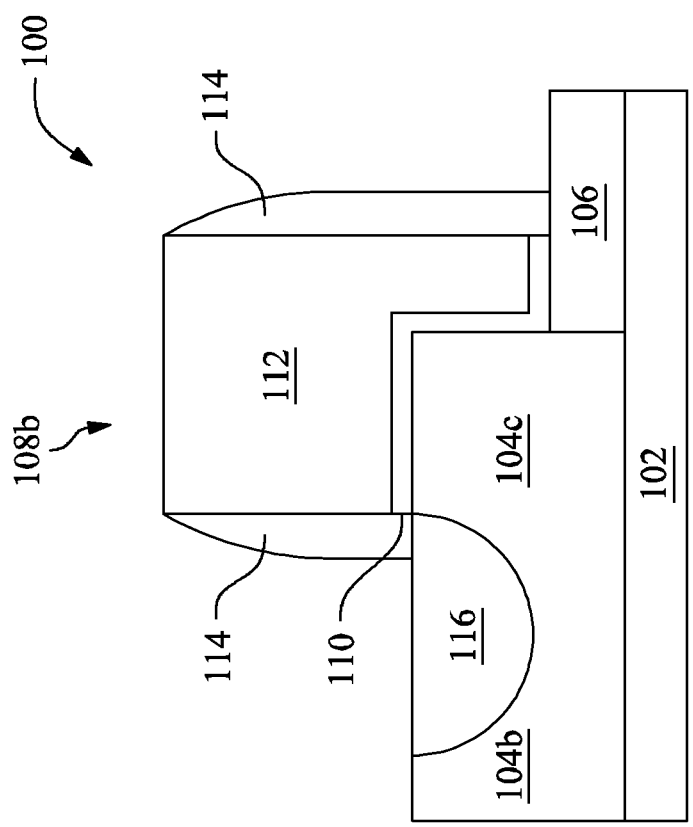
FIG. 6 illustrates a cross-sectional view of the semiconductor device of FIG. 5A after further features are fabricated in accordance with some embodiments.

FIG. 6 illustrates a cross-sectional view of the device 100 along the 8-8 line of FIG. 5B after further fabrication processes. Particularly, a gate spacer 114 is formed over sidewalls of the gate 108b and doped source/drain (or S/D) regions 116 are formed in the arms 104a (not shown) and 104b adjacent the gate 108b. Although not shown, similar features (gate spacer and S/D regions) are also formed on and/or adjacent the gate 108a (FIG. 5A) in an embodiment.

The gate spacer 114 may include materials such as silicon nitride, silicon oxide, silicon oxynitride, and/or other suitable dielectric. The gate spacer 114 may be formed using suitable deposition and etching techniques and may include a single layer or any plurality of layers. For example, the gate spacer 114 may include a seal gate spacer and a dummy gate spacer disposed on the seal gate spacer. The seal gate spacer is formed of silicon nitride and protects the approximately vertical sides of the gate structure 108b from, e.g., metal diffusion or accidentally shorting with raised source/drain (not shown). The dummy gate spacer can be a multi-layer structure each composed of silicon oxide, silicon nitride, silicon oxynitride, other dielectric material, or combination thereof. In some cases, the dummy gate spacer may be used for offset and self-align purposes when the S/D regions 116 are doped.

The S/D regions 116 are formed in the arms 104a and 104b adjacent the gate 108b. In an embodiment, the S/D regions 116 are doped with a p-type dopant for forming a p-type FinFET. In another embodiment, the S/D regions 116 are doped with an n-type dopant for forming an n-type FinFET. The S/D regions 116 may include halo or lightly doped drain (LDD) implantation, source/drain implantation, source/drain activation and/or other suitable processes. In some embodiments, the S/D regions 116 may include raised source/drain regions, strained regions, epitaxially grown regions, and/or other suitable techniques. In a further embodiment, the source/drain activation process may include a rapid thermal annealing (RTA). In an embodiment, the S/D regions 116 include silicidation. Silicidation can be formed by a process that includes depositing a metal layer, annealing the metal layer such that the metal layer is able to react with silicon to form silicide, and then removing the non-reacted metal layer.

Further operations are performed to complete the fabrication of the device 100. For example, an inter-layer dielectric (ILD) layer may be formed over the substrate 102 covering the gate spacer 114, the gates 108a and 108b, the S/D regions 116, the fin 104, and the isolation structure 106. In an embodiment, the ILD layer is formed by a flowable CVD (FCVD) process. The FCVD process includes depositing a flowable material (such as a liquid compound) on the substrate 102 to fill the trenches and converting the flowable material to a solid material by a suitable technique, such as annealing in one example. For example, a replacement gate process (or gate-last process) may be performed to replace the poly layer 112 of the gates 108a/108b with metal layer(s). For example, vias and contacts may be formed to electrically connect the S/D regions 116 and the gates 108a/108b to other portions of the device 100 to form an IC.

Figure 7:
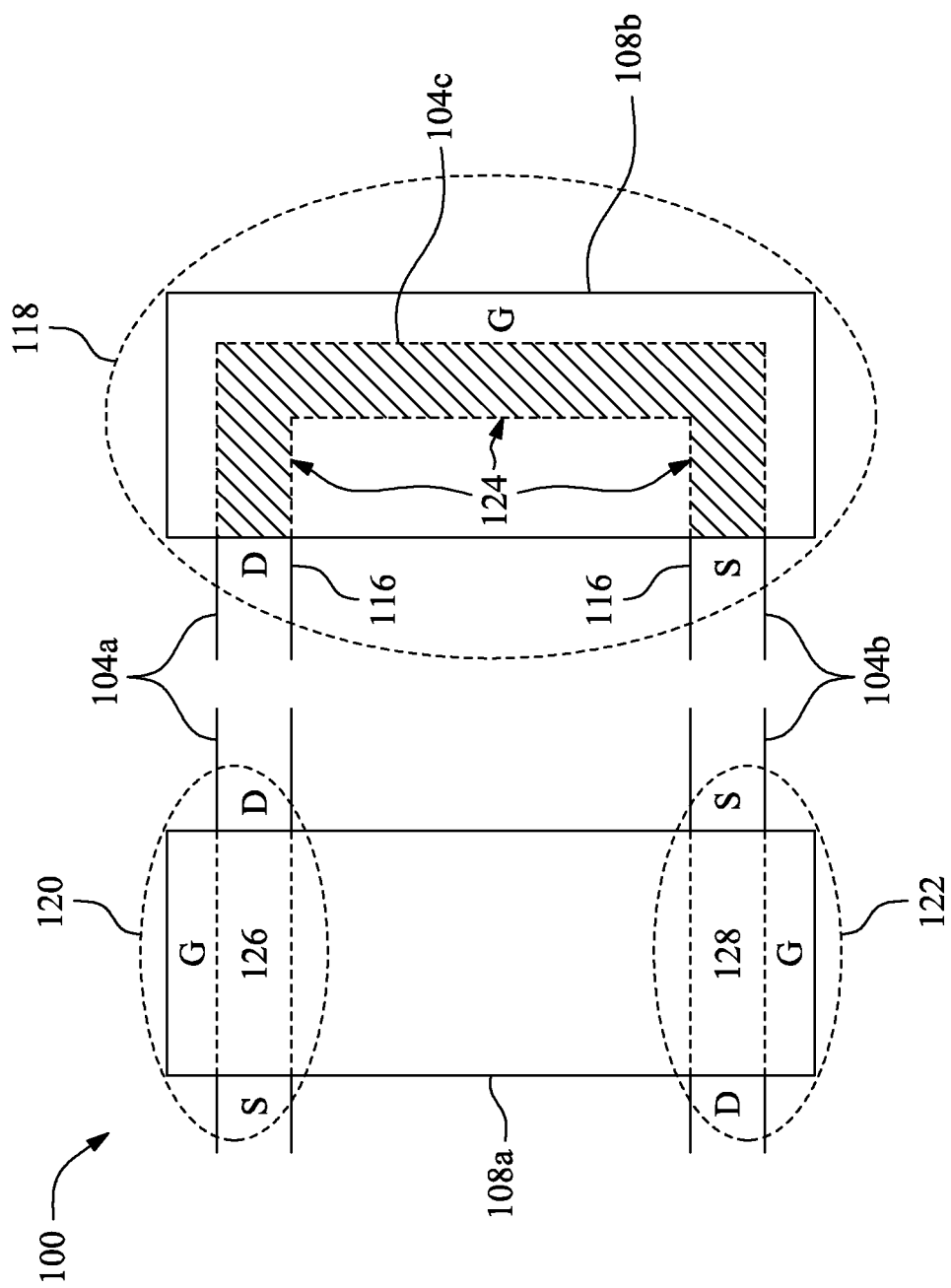
FIG. 7 illustrates a top view of the semiconductor device of FIG. 1.

Referring to FIG. 7, shown therein are three transistors 118, 120, and 122 formed by the above processes. The transistor 118 includes the S/D regions 116 formed in the arms 104a and 104b adjacent the gate 108b, and a channel region 124 formed in the fin 104 between the S/D regions 116, as shown by the shaded area in FIG. 7. The channel region 124 includes the bridge 104c and, optionally, part of the arms 104a and 104b. The S/D regions 116 and the gate 108b constitute the source (S), drain (D), and gate (G)

terminals of the transistor 118, which is a FinFET transistor with a u-shaped channel region (also referred to as a u-shaped FinFET). The transistors 120 and 122 are formed by the gate 108a engaging the arms 104a and 104b respectively, and each include a respective channel, 126 and 128, between the respective S/D regions. The channels 126 and 128 do not have the u-shape like the channel 124 does. In an embodiment, the transistors 118 and 120 share the S/D region 116 (e.g., their D terminals in FIG. 7). Similarly, in an embodiment, the transistors 118 and 122 share the S/D region 116 (e.g., their S terminals in FIG. 7). In various embodiments, the transistors 118 and 120 (or 122) may be of the same conductivity type (e.g., both are n-type or p-type) or opposite conductivity types (e.g., one is n-type and the other is p-type).

One benefit of the u-shaped FinFET 118 constructed according to the present disclosure is that it utilizes an area of the substrate 102 which otherwise would be wasted. For example, in a typical spacer process, the portion of the spacer 92 (FIG. 3A) corresponding to the bridge 104c is removed using a cut process. Subsequently, fins formed using such spacer would not have the bridge 104c. In contrast, the u-shaped FinFET 118 enables higher utilization of the substrate 102 and can be used to make more compact IC designs. Some non-limiting applications of the u-shaped FinFET devices are illustrated in FIGS. 8B and 10B, which will be discussed below.

FIG. 8A shows a schematic of a SRAM cell 200. The SRAM cell 200 includes two inverters 202 and 204 cross-coupled for data storage. Each of the inverters 202 and 204 includes a pull-up (PU) device and a pull-down (PD) device. Specifically, the inverter 202 includes a PU device 206 and a PD device 208, and the inverter 204 includes a PU device 210 and a PD device 212. The SRAM cell 200 further includes two pass-gate (PG) devices 214 and 216 coupled with the inverters 202 and 204 for accessing the data storage. Specifically, the PG device 214 is coupled with the inverters 202 and 204 through a node 218, and the PG device 216 is coupled with the inverters 202 and 204 through a node 220. In various embodiments, each of the PU and PD devices may include one or more transistors of the same type (p- or n-type) to increase performance of the SRAM cell 200, such as faster switching speed.

FIG. 8B shows a layout diagram of some layers of the SRAM cell 200, according to various aspects of the present disclosure. Specifically, the PD device 208 in the design of FIG. 8A is made up of two PD devices 208a and 208b in the layout of FIG. 8B. The source, drain, and gate terminals of the PD device 208a are electrically coupled to the respective source, drain, and gate terminals of the PD device 208b for increasing current in the NMOS transistors, which results in faster transition of the SRAM cell from storage state "1" to storage state "0." Similarly, the PD device 212 in the design of FIG. 8A is made up of two PD devices 212a and 212b in the layout of FIG. 8B, where the source, drain, and gate terminals of the PD device 212a are electrically coupled to the respective source, drain, and gate terminals of the PD device 212b.

Still referring to FIG. 8B, the PU devices 206 and 210 are made up of u-shaped FinFET devices constructed according to various aspects of the present disclosure. The PU device 206 includes a fin ("OD" in the legend) formed over a substrate (not shown), wherein the fin has first and second arm portions and a bridge portion. The first and second arm portions are oriented along "x" direction and spaced away by a fin pitch "P3," the bridge portion is oriented along "y" direction that is orthogonal to the "x" direction, and the bridge portion connects the first and second arm portions. The PU device 206 further includes a gate ("PO" in the legend) over the substrate, wherein the gate is oriented along the "y" direction and engages the fin at both the first and second arm portions and the bridge portion. The PU device 206 further includes a drain region formed in the first arm portion, coupled to a node Vdd, and a source region formed in the second arm portion, coupled to the node 218. The channel region of the PU device 206 is formed in the fin between the source and drain regions of the PU device 206.

The PU device 210 is similarly constructed. Specifically, the PU device 210 includes a fin ("OD" in the legend) formed over the substrate (not shown), wherein the fin has first and second arm portions and a bridge portion. The first and second arm portions are oriented along the "x" direction and spaced away by the pitch "P3," the bridge portion is oriented along the "y" direction, and the bridge portion connects the first and second arm portions of the PU device 210. The PU device 210 includes a gate ("PO" in the legend) over the substrate, wherein the gate is oriented along the "y" direction and engages the fin at both the first and second arm portions and the bridge portion. The PU device 210 further includes a drain region formed in the first arm portion, coupled to the node Vdd, and a source region formed in the second arm portion, coupled to the node 220. The channel region of the PU device 210 is formed in the fin between the source and drain regions of the PU device 210.

Additionally, the second arm portions of the PU devices 206 and 210 are aligned lengthwise in the "x" direction and are a part of a common fin structure. The first arm portions of the PU devices 206 and 210 are disposed on opposite sides of the common fin structure. The PD devices 208b and 212b are formed at least partially with a portion of the common fin structure, and are disposed between the two PU devices 206 and 210. Furthermore, the PU device 206 and the PD device 208a share a gate structure, and the PU device 210 and the PD device 212a share a gate structure. The gate structures for the various PU and PD devices are spaced away in the "y" direction by a gate pitch "P4."

In terms of substrate usage, the SRAM cell 200 occupies three (3) fins in the "x" direction and four (4) gates in the "y" direction. Therefore, it uses twelve (12) units per SRAM bit. In an embodiment, the fin pitch "P3" is 60 nanometer (nm) and the gate pitch "P4" is 90 nm. To further this embodiment, the SRAM cell 200 occupies 0.0648 square micrometers ($\mu m^2$) per bit. This is comparatively smaller than SRAM cells manufactured without u-shaped FinFETs.

Another benefit of the u-shaped FinFET constructed according to the present disclosure is that it reduces (metal) interconnects of an IC. FIGS. 9A and 9B illustrate such an example. As shown in FIGS. 9A and 9B, device 402 and device 404 each include seven (7) transistors formed over two fins and connected in a cascaded manner. The device 402 does not include a u-shaped FinFET and couples source terminals of two transistors with a local interconnect 406. The device 404 includes a u-shaped FinFET 408, obviating the need for the local interconnect 406. In addition, the device 404 occupies smaller substrate areas (2 fin pitches and 4 gate pitches) than the device 404 (2 fin pitches and 5 gate pitches). Both the smaller areas and less local interconnects in the device 404 are attributable to the use of the u-shaped FinFET 408.

Figure 10:
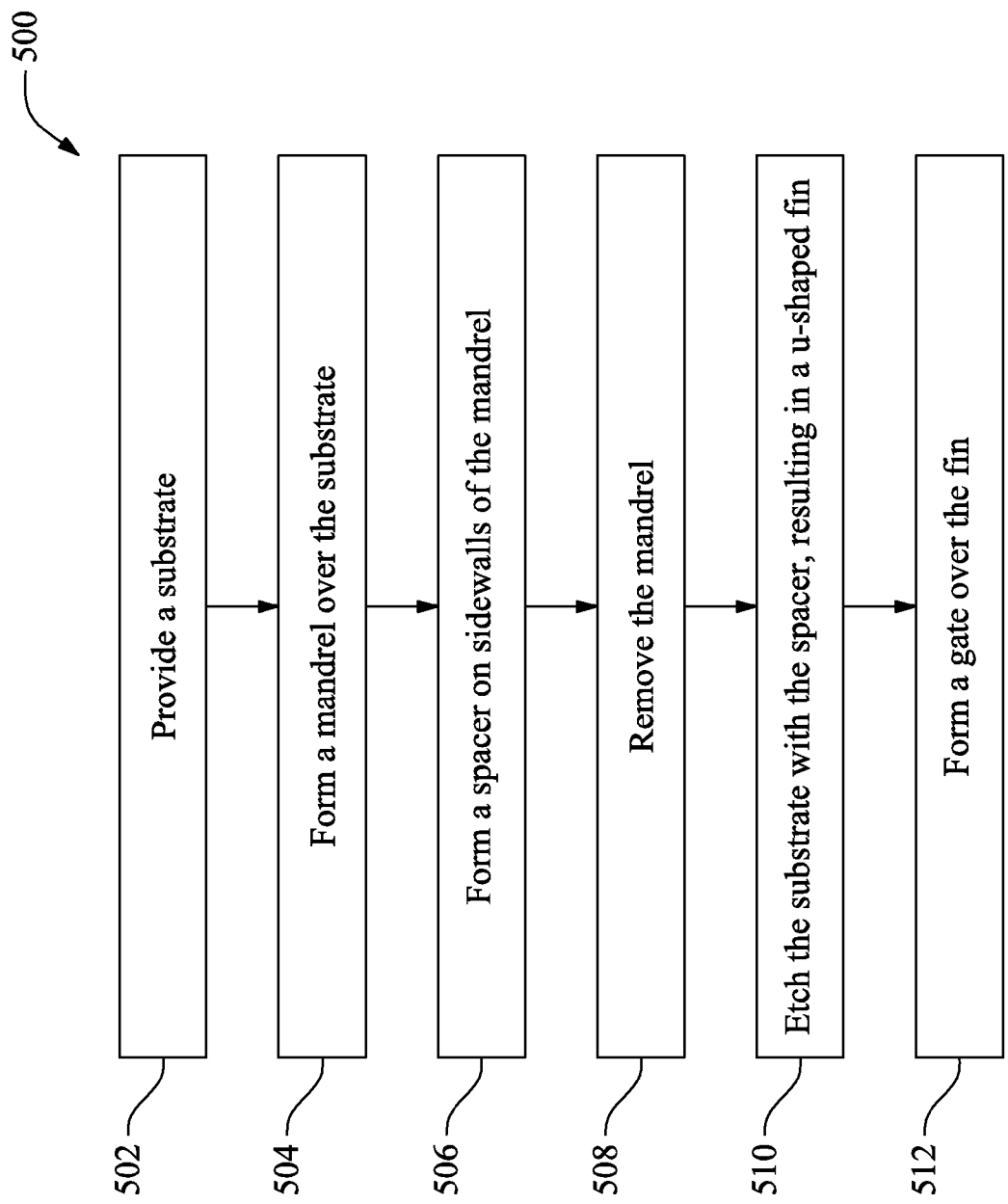
FIG. 10 shows a flow chart of a method of fabricating a semiconductor device, according to various aspects of the present disclosure.

Referring to FIG. 10, shown therein is a method 500 of forming a semiconductor device according to various aspects of the present disclosure. The method 500 is an example, and is not intended to limit the present disclosure beyond what is explicitly recited in the claims. Additional operations can be provided before, during, and after the method 500, and some operations described can be replaced, eliminated, or moved around for additional embodiments of the method. The method 500 is described below in conjunction with FIGS. 1-6 discussed above.

At operation 502, the method 500 is provided with a substrate 102 (FIGS. 2A and 2B). The substrate 102 may be a silicon substrate and may include one or more material layers, as discussed above. At operation 504, the method 500 forms a mandrel pattern 90 over the substrate 102 (FIGS. 2A and 2B). The mandrel pattern 90 may be a line pattern in an embodiment or a trench pattern in another embodiment. At operation 506, the method 500 forms a spacer 92 on sidewalls of the mandrel pattern 90 (FIGS. 2A and 2B). At operation 508, the method 500 removes the mandrel pattern 90 and leaves the spacer 92 over the substrate 102 (FIGS. 3A and 3B). At operation 510, the method 500 etches the substrate 102 with the spacer 92 as an etch mask, resulting in u-shaped fin(s) 104 over the substrate 102 (FIGS. 4A and 4B). Subsequently, the method 500 may form an isolation structure 106 over the substrate 102 and around the fin(s) 104 (FIG. 1). At operation 512, the method 500 forms gate structures, such as the gates 108a and 108b, over the fin(s) 104 (FIG. 5A). At least one of the gate structures engages the u-shaped fin(s) 104 and forms a u-shaped FinFET device thereof. The method 500 may include additional operations, such as forming gate spacers, forming doped S/D regions, forming an ILD layer, forming vias and contacts, and forming metal interconnects.

Although not intended to be limiting, one or more embodiments of the present disclosure provide many benefits to a semiconductor device and the formation thereof. For example, u-shaped FinFET devices enable greater utilization of a substrate, contribute to dense SRAM design, and reduce interconnects in cascaded transistor designs. For another example, u-shaped FinFET process flow reduces the number of processes, such as cut processes, in semiconductor fabrication. Therefore, it increases productivity of semiconductor manufacturing.

In one exemplary aspect, the present disclosure is directed to a semiconductor device. The semiconductor device includes a substrate and a fin over the substrate, wherein the fin has a u-shape from a top view with first and second arm portions and a bridge portion connecting the first and second arm portions. The semiconductor device further includes a first gate over the substrate, wherein the first gate engages the fin at both the first and second arm portions and the bridge portion thereby forming a first transistor. A source region of the first transistor is formed in the first arm portion, a drain region of the first transistor is formed in the second arm portion, and a channel region of the first transistor is formed in the fin between the source region and the drain region.

In another exemplary aspect, the present disclosure is directed to a static random access memory (SRAM) cell. The SRAM cell includes first and second inverters cross-coupled for data storage. The first inverter includes a first pull-up (PU) device and a first pull-down (PD) device. The second inverter includes a second PU device and a second PD device. The SRAM cell further includes two pass-gate (PG) devices coupled with the first and second inverters. The first PU device includes a first fin formed over a substrate. The first fin has first and second arm portions and a first bridge portion. The first and second arm portions are oriented along a first direction and spaced away by a first pitch. The first bridge portion is oriented along a second direction orthogonal to the first direction. The first bridge portion connects the first and second arm portions. The first PU device further includes a first gate over the substrate, wherein the first gate is oriented along the second direction and engages the first fin at both the first and second arm portions and the first bridge portion. The first PU device further includes a first drain region formed in the first arm portion; a first source region formed in the second arm portion; and a first channel region formed in the first fin between the first source region and the first drain region.

In another exemplary aspect, the present disclosure is directed to a method of forming a semiconductor device. The method includes forming a mandrel pattern over a substrate and forming a spacer on sidewalls of the mandrel pattern. The method further includes removing the mandrel pattern thereby forming a first pattern over the substrate with at least a portion of the spacer. The method further includes transferring the first pattern to the substrate thereby forming a fin over the substrate, wherein the fin has a u-shape from a top view with first and second arm portions and a bridge portion connecting the first and second arm portions. The method further includes forming a gate over the substrate, wherein the gate engages the fin at both the first and second arm portions and the bridge portion.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a fin over the substrate, wherein the fin has first and second arm portions and a bridge portion connecting the first and second arm portions;
   over the substrate, a first gate including a first interfacial layer and a first conductive layer over the first interfacial layer, wherein the first gate engages the fin at both the first and second arm portions and the bridge portion thereby forming a first transistor, wherein a top surface of the first gate has a rectangular shape; and
   over the substrate, a second gate engaging the fin at the first arm portion and thereby forming a second transistor,
   wherein a source region of the first transistor is formed in the first arm portion, a drain region of the first transistor is formed in the second arm portion, and a channel region of the first transistor is formed in a portion of the fin including the bridge portion, wherein the source and drain regions are on a same side of the channel region from the top view, wherein the channel region is u-shaped and defined by at least a portion of the first and second arm portions and the bridge portion in a manner having a space formed therebetween, wherein inner and outer sidewalls of the channel region are both conformally covered by the first interfacial layer, and wherein the first conductive layer and the first interfacial layer completely fills the space.

2. The semiconductor device of claim 1, wherein the bridge portion forms a curvy intersection with each of the first and second arm portions.

3. The semiconductor device of claim 1, wherein:
the first and second arm portions are oriented along a first direction and spaced away from each other;
the bridge portion is oriented along a second direction that is orthogonal to the first direction; and
the first and second gates are oriented along the second direction.

4. The semiconductor device of claim 1, wherein the first gate engages the fin at a top surface and sidewalls of the fin.

5. The semiconductor device of claim 1, wherein the first and second transistors are of opposite conductivity types.

6. The semiconductor device of claim 1, wherein the first and second transistors share the source region.

7. The semiconductor device of claim 1, wherein the second gate further engages the second arm portion thereby forming a third transistor.

8. The semiconductor device of claim 7, wherein the first and second transistors share the source region, and the first and third transistors share the drain region.

9. The semiconductor device of claim 1, wherein the second gate comprises a second interfacial layer and a second conductive layer over the second interfacial layer.

10. A semiconductor device, comprising:
a first fin formed over a substrate, wherein the first fin has first and second arm portions and a first bridge portion, the first and second arm portions are oriented along a first direction and spaced away by a first pitch from a top view, the first bridge portion is oriented along a second direction different from the first direction from the top view, and the first bridge portion connects the first and second arm portions;
a first gate over the substrate, the first gate comprising an interfacial layer and a conductive layer over the interfacial layer, wherein a top surface of the first gate has a rectangular shape, wherein the first gate engages the first fin at both the first and second arm portions and the first bridge portion thereby forming a first transistor;
a first drain region of the first transistor formed in the first arm portion;
a first source region of the first transistor formed in the second arm portion; and
a first channel region of the first transistor formed in the first fin between the first source region and the first drain region, wherein the first drain region and the first source region are on a same side of the first channel region from the top view, wherein the first channel region is u-shaped and defined by at least a portion of the first and second arm portions and the first bridge portion in a manner having a space formed therebetween, wherein the interfacial layer conformally covers the inner and outer sidewalls of the first channel region, wherein the conductive layer and the interfacial layer completely fills the space.

11. The semiconductor device of claim 10, further comprising:
a first pull-down (PD) device, wherein the first PD device and the first transistor are coupled to form a first inverter;
a second PD device and a second transistor, wherein the second PD device and the second transistor are coupled to form a second inverter; and
two pass-gate (PG) devices coupled with the first and second inverters,
wherein the first and second inverters are cross-coupled for data storage,
wherein the second transistor includes:
a second fin formed over the substrate, wherein the second fin has third and fourth arm portions and a second bridge portion, the third and fourth arm portions are oriented along the first direction and spaced away by the first pitch, the second bridge portion is oriented along the second direction, and the second bridge portion connects the third and fourth arm portions;
a second gate over the substrate, wherein the second gate engages the second fin at both the third and fourth arm portions and the second bridge portion;
a second drain region formed in the third arm portion;
a second source region formed in the fourth arm portion; and
a second channel region formed in the second fin between the second source region and the second drain region, wherein the second drain region and the second source region are on a same side of the second channel region from the top view.

12. The semiconductor device of claim 11, wherein:
the second and fourth arm portions are aligned lengthwise in the first direction and are a part of a common structure; and
the first and third arm portions are disposed on opposite sides of the common structure.

13. The semiconductor device of claim 12, further comprising a third PD device and a fourth PD device, wherein:
each of the third and fourth PD devices is formed at least partially with a portion of the common structure;
source, drain, and gate terminals of the third PD device are electrically coupled to respective source, drain, and gate terminals of the first PD devices; and
source, drain, and gate terminals of the fourth PD device are electrically coupled to respective source, drain, and gate terminals of the second PD devices.

14. The semiconductor device of claim 11, wherein:
the first transistor and the first PD device share the first gate; and
the second transistor and the second PD device share the second gate.

15. A semiconductor device, comprising:
a substrate;
a fin over the substrate, wherein the fin includes first and second arm portions and a bridge portion connecting the first and second arm portions; and
over the substrate, a first gate including a conformal interfacial layer and a leveling conductive layer over the interfacial layer, wherein the first gate engages the fin at both the first and second arm portions and the bridge portion through the conformal interfacial layer thereby forming a first transistor, wherein a top surface of the first gate has a rectangular shape and is planar,
wherein:
the first and second arm portions are oriented along a first direction and spaced away from each other from a top view;
the first gate is oriented, from the top view, along a second direction that is orthogonal to the first direction;
source and drain regions of the first transistor are formed in the first and second arm portions, and channel region of the first transistor is u-shaped and defined by at least a portion of the first and second arm portions and the bridge portion in a manner having a space formed therebetween, wherein inner and outer sidewalls of the channel region are both conformally covered by the conformal interfacial layer, and wherein the leveling conductive layer and the conformal interfacial layer completely fills the space, wherein inner and outer sidewalls of the u-shaped channel region are both surrounded by the first gate; and the source and drain regions are on a same side of the channel region from the top view.

16. The semiconductor device of claim 15, wherein the bridge portion forms a curvy intersection with each of the first and second arm portions.

17. The semiconductor device of claim 15, further comprising:

a second gate disposed over the substrate and engaging the fin solely at the first arm portion thereby forming a second transistor, wherein the second gate does not engage the fin at the second arm portion.

18. The semiconductor device of claim 17, wherein the first and second transistors share one of: a source region and a drain region.

19. The semiconductor device of claim 15, further comprising:

a second gate disposed over the substrate and engaging the fin at both the first and second arm portions thereby forming respective second and third transistors.

20. The semiconductor device of claim 19, wherein the first and second transistors share a source region, and the first and third transistors share a drain region.

* * * * *